United States Patent [19]

Ryken

[11] 4,032,859
[45] June 28, 1977

[54] 1 TO 18 GHZ MICROWAVE SIGNAL GENERATOR

[75] Inventor: Marvin L. Ryken, Ventura, Calif.

[73] Assignee: The United States of America as represented by the Secretary of the Navy, Washington, D.C.

[22] Filed: Sept. 2, 1976

[21] Appl. No.: 719,780

[52] U.S. Cl. .................................. 331/53; 328/16; 331/96; 331/183
[51] Int. Cl.² ........................................ H03B 19/00
[58] Field of Search .......... 331/107 R, 94, 53, 183; 321/69 R, 69 W, 69 NL, 60; 328/16, 17, 18, 19

[56] References Cited

UNITED STATES PATENTS

| | | | |
|---|---|---|---|
| 3,546,624 | 12/1970 | Omori | 331/107 G |
| 3,576,503 | 4/1971 | Hanson | 331/96 |
| 3,706,048 | 12/1972 | Johnston | 331/53 |
| 3,883,824 | 5/1975 | Weiner | 331/96 |
| 3,909,746 | 9/1975 | Abraham | 331/96 |

Primary Examiner—John Kominski
Attorney, Agent, or Firm—Richard S. Sciascia; Joseph M. St.Amand; William W. Cochran, II

[57] ABSTRACT

A device for generating a signal varying in frequency from 1 to 18 GHz at a constant output power. The device utilizes a tracking automatic level loop and reacquire loop which provide automatic alignment of a YIG multiplier filter with a YIG voltage-controlled oscillator (VCO). Adjustability of output power level control is provided in the tracking automatic level loop with a provision for LED display when the device loses lock.

10 Claims, 6 Drawing Figures

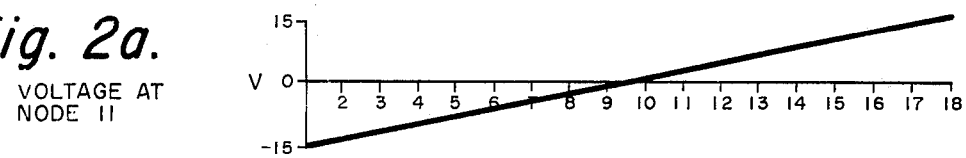
Fig. 2a. VOLTAGE AT NODE 11
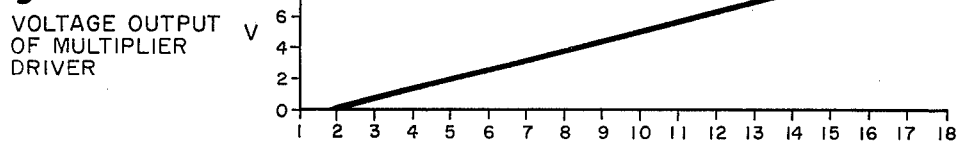
Fig. 2b. VOLTAGE OUTPUT OF MULTIPLIER DRIVER
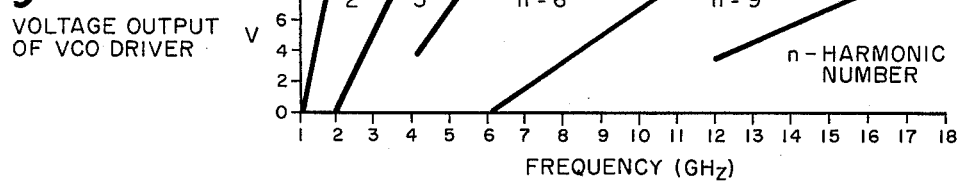
Fig. 2c. VOLTAGE OUTPUT OF VCO DRIVER
FREQUENCY (GHz)
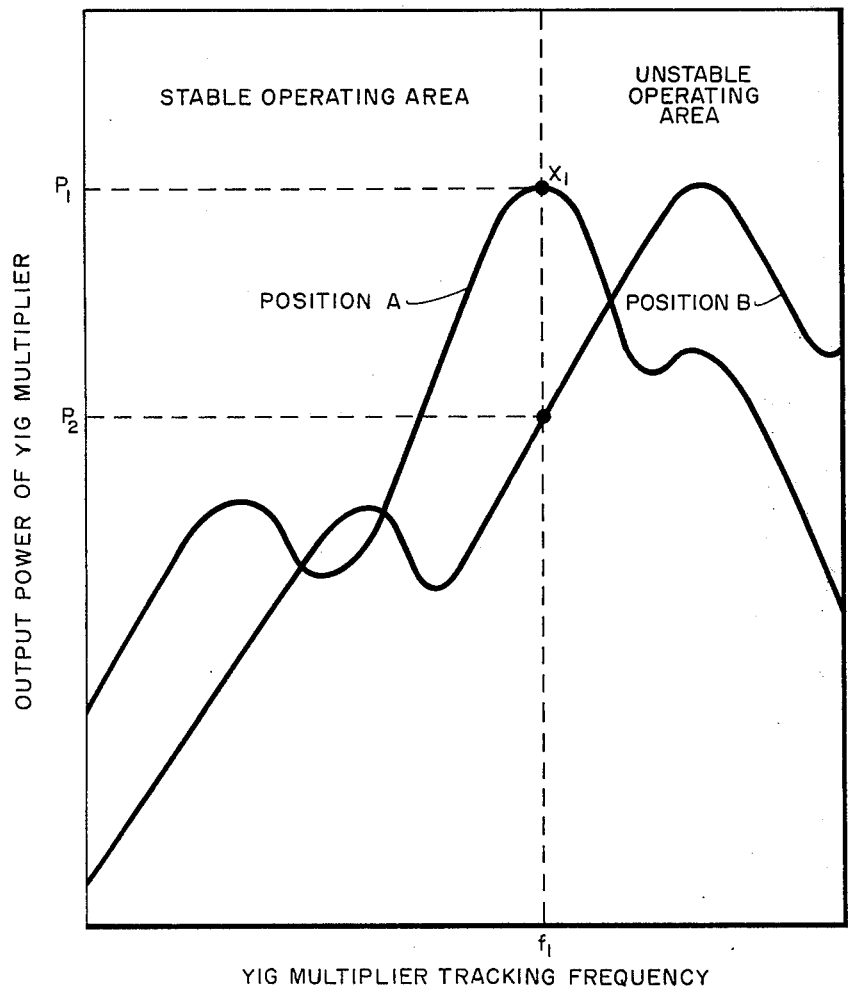
Fig. 3.

1 TO 18 GHZ MICROWAVE SIGNAL GENERATOR

BACKGROUND OF THE INVENTION

The present invention pertains generally to signal generators and more particularly to high frequency, wideband harmonic signal generators. Signal generators of this generic type have previously used a number of narrow frequency range oscillators which provide a wide frequency range by switching between the oscillators for each narrow frequency band. Stable power output and smooth frequency generation have been difficult to achieve in this type of wideband signal generator.

Another type of wideband generator has utilized an oscillator-multiplier approach which selects various harmonic frequencies of a single oscillator. When this approach has been used, complicated and unreliable methods of compensating for tuning nonlinearities have been resorted to. Typically, diode function generators have been relied upon to compensate for the tuning nonlinearities, but the unreliability of this method of compensation is inherent. This unreliability stems from temperature variations and inherent hysteresis of the yittrium iron garnate (YIG) oscillator and YIG multiplier, which together cause tracking alignment problems resulting in excessive power variations across the frequency range. In an attempt to attain leveled output power versus frequency, previous devices have used automatic level loops consisting of pin diode attenuators, directional couplers, crystal detectors and amplifiers. These devices, however, have been expensive to implement and have generally not provided the desired result, i.e., constant output power across the frequency range from 1 to 18 GHz.

SUMMARY OF THE INVENTION

The present invention overcomes the disadvantages and limitations of the prior art by providing an improved 1 to 18 GHz microwave signal generator. This is accomplished by the use of a frequency tracking, automatic power level loop and reacquire loop which vary the offset voltage to the filter tracking frequency input of the YIG multiplier so that the YIG multiplier filter tracks in conjunction with the proper harmonic frequency of the voltage-controlled oscillator and tunes the YIG multiplier filter to attain a leveled output power response. An additional feature of the invention is that it limits the reacquire frequency range and visually indicates when the device loses lock.

It is therefore an object of the present invention to provide an improved wideband microwave signal generator.

It is also an object of the present invention to provide a wideband microwave signal generator having leveled output power across its frequency range.

Another object of the present invention is to provide a wideband microwave signal generator which has stable frequency adjustment.

Another object of the present invention is to provide a wideband microwave signal generator which is inexpensive to implement.

Another object of the present invention is to provide a wideband microwave signal generator which is compact in size.

Other objects and further scope of applicability of the present invention will become apparent from the detailed description given hereinafter. The detailed description, indicating the preferred embodiment of the invention, is given only by way of illustration since various changes and modifications within the spirit and scope of the invention will become apparent to those skilled in the art from this detailed description. The foregoing abstract of the disclosure is for the purpose of providing a non-legal brief statement to serve as a searching and scanning tool for scientists, researchers and engineers and is not intended to limit the scope of the invention as disclosed herein, nor is it intended to be used in interpreting or in any way limiting the scope or fair meaning of the appended claims.

BRIEF DESCRIPTION OF THE DRAWINGS

FIG. 2a is a plot of the voltage at node 11 versus output frequency.

FIG. 2b is a plot of output voltage from the multiplier driver versus output frequency.

FIG. 2c is a plot of output voltages of the VCO driver versus frequency.

FIG. 3 is a plot of the filter frequency response of the YIG multiplier versus output power from the YIG multiplier.

DETAILED DESCRIPTION OF THE PREFERRED EMBODIMENT

Figure 1:
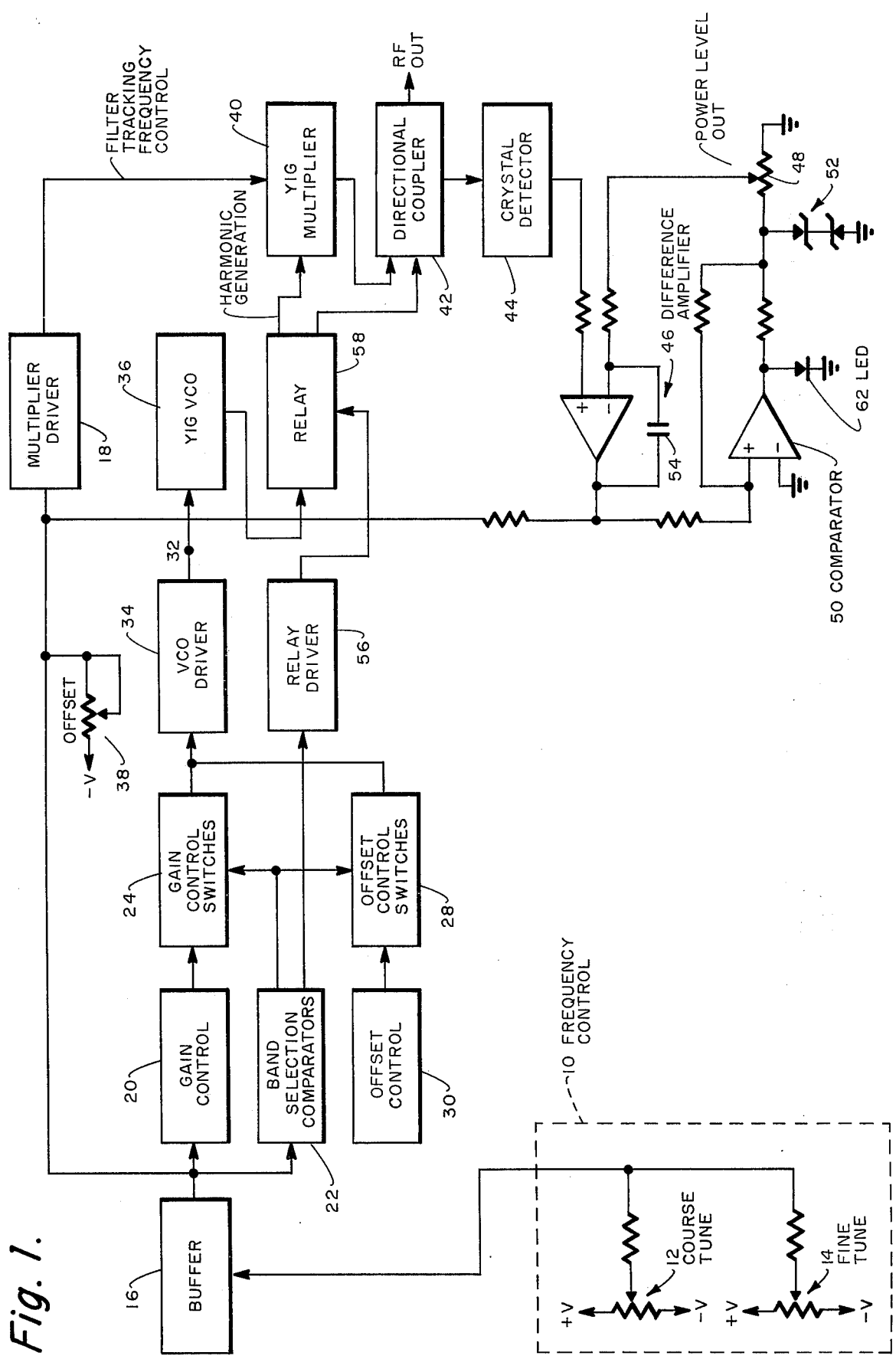
FIG. 1 is a block diagram of the preferred embodiment of the invention.

Referring to FIG. 1, frequency control 10 provides a continuous control of the frequency of the signal generator over the range from 1 to 18 GHz. In general, the frequency ranges are obtained by selecting appropriate harmonics of the voltage-controlled oscillator (VCO) as it is tuned between the range from 1 to 2 GHz. In the output signal, the frequency range from 1 to 2 GHz is obtained from the fundamental of the VCO while the 2 to 4 GHz range is obtained from the second harmonic, the 4 to 6 GHz range is obtained from the third harmonic, the 6 to 12 GHz from the sixth harmonic, and the 12 to 18 GHz range from the ninth harmonic.

The frequency control functions to generate a voltage which varies along a range such as from $-15V$ to $+15V$, which is proportional to the desired output frequency of the device. To obtain accurate tuning, both a coarse control 12 and a fine control 14 are included within the frequency control 10. This output voltage is applied to a buffer 16 which functions to filter and smooth the DC voltage. The DC voltage signal from buffer 16 is applied to multiplier driver 18, gain control 20, and band selection comparators 22.

In operation, a series of band selection comparators 22 select certain voltage ranges of the DC signal produced at node 11 and selectively control the state of gain control switches 24 and offset control switches 28. If, for example, the DC signal at node 11 varies between $-15V$ and $+15V$, band selection comparators 22 produce signals at their output for successive voltage intervals between the $-15V$ and the $+15V$ range to control the state of the gain control switches 24 and offset control switches 28. Therefore, the DC voltage produced at node 32 is provided with a series of amplification gains and initial voltage offsets to produce a series of voltage functions, shown in FIG. 2c, as the DC voltage at node 11 varies between $-15V$ and $+15V$. These series of voltage functions are applied to the YIG voltage-controlled oscillator (VCO) 36. The YIG VCO produces an output waveform in response to this series of DC voltage functions which varies linearly between 1 and 2 GHz proportionally with voltage.

The DC voltage at node 11 is also applied to multiplier driver 18 via buffer 16 with offset voltage being provided by 38. The input DC voltage to multiplier driver 18 is filtered in the multiplier driver and applied to the filter tracking frequency control input of YIG multiplier 40. The output DC voltage of multiplier driver 18 functions to control the frequency of the tracking filter of the YIG multiplier and linearly varies the frequency of the filter over the frequency range of 1 to 18 GHz as the voltage at the output of buffer 16 varies between −15V and +15V.

The frequency of the microwave output signal of the YIG VCO 36 varies linearly between 1 and 2 GHz proportionally with the voltage input. This microwave signal is applied either to a directional coupler 42 or YIG multiplier 40 depending upon the state of relay 58. For a desired output between 1 and 2 GHz, as determined by frequency control 10, relay driver 56 activates relay 58 to apply the YIG VCO output to directional coupler 42. At all other desired frequencies, relay 58 is activated in its opposite state to apply the YIG VCO output to YIG multiplier 40. The fundamental frequency of 1 to 2 GHz is therefore coupled directly to the output of the device.

The frequency of the YIG VCO output signal constitutes a series of five ranges that vary in frequency from 1 to 2 GHz as the desired frequency is varied between 1 to 18 GHz via frequency control 10. Four of the five ranges are applied to the harmonic generation input of YIG multiplier 40 to produce the harmonics necessary to provide an output signal which varies between 2 and 18 GHz (the 1 to 2 GHz output signal being derived directly from the VCO via relay 58). For each of the four ranges varying between 1 and 2 GHz, which are applied to the harmonic generation input of the YIG multiplier, the tracking filter selects the proper harmonic frequency as controlled by the output DC voltage of the multiplier driver to provide an output signal from YIG multiplier 40 which varies between 2 and 18 GHz. Directional coupler 42 samples a small portion of the power output of the RF signal which varies between 1 and 18 GHz and applies it to a crystal detector 44 which produces a DC voltage signal proportional to the sampled output power. The DC signal from crystal detector 44 is applied to difference amplifier 46 which compares output power to a desired power level provided by potentiometer 48. Difference amplifier 48 amplifies the difference between the desired power output level and the input power level. The difference voltage at the output of difference amplifier 46 is then applied to the offset control of the multiplier driver 18 such that the tracking frequency of the YIG multiplier 40 is varied until the output power level matches desired power level. This is accomplished by varying the tracking frequency of the YIG filter until its power response matches the desired output power level. Difference amplifier 46 therefore produces a DC voltage signal which varies the offset voltage input to the filter tracking frequency control of the multiplier driver which varies power output response of the YIG multiplier 40 for the desired harmonic frequency.

The output of the difference amplifier 46 is also applied to a comparator 50 to sense a loss of lock and limit the voltage excursion of the output of difference amplifier 46 if the power output level of potentiometer 48 is set too high. Comparator 50 detects whenever the output of the difference amplifier 46 exceeds a predetermined voltage such as, for example, ±1VDC. Positive feedback in the comparator 50 provides hysteresis and causes the comparator to always stay in a saturated condition. Under normal conditions, i.e., when the output of difference amplifier is between ±1V, the output of the comparator is some predetermined negative voltage such as −5V. When the output of the difference amplifier 46 exceeds ±1V, the comparator 50 becomes saturated in the opposite condition and produces an output of +5V. Difference amplifier 46 then compares the output power with the new desired output level and slowly varies its output voltage to indicate the new output difference voltage. The offset voltage is therefore varied across the zero potential constantly until the desired output power level is decreased to a point where the actual RF output power level equals the desired output power level. In this manner, the feedback loop of comparator 50 comprises a reacquire loop in which the device continues to search for the desired frequency to produce a particular power output.

Figure 4:
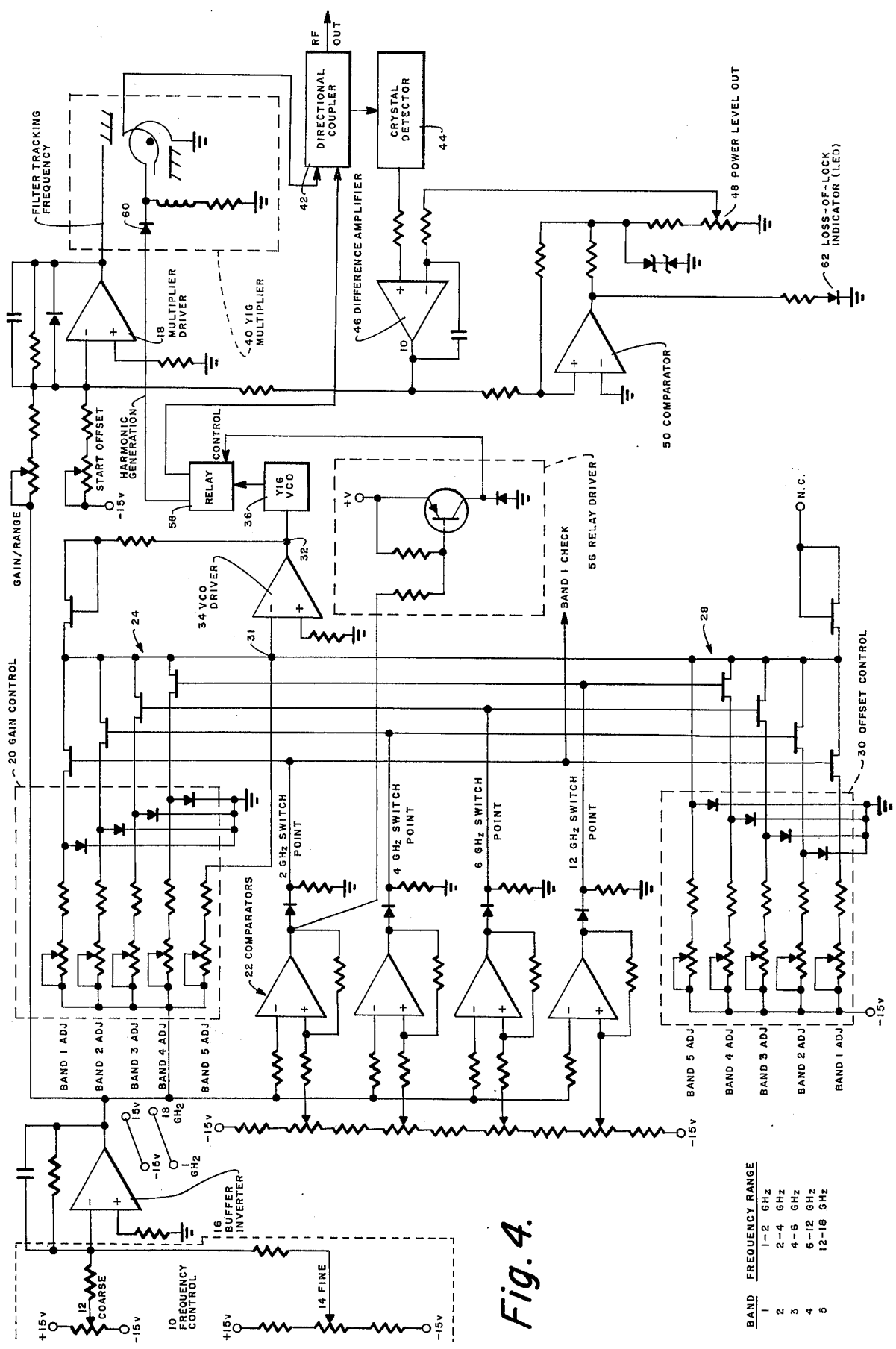
FIG. 4 is a detailed schematic diagram of the preferred embodiment of the invention.

FIG. 4 is a detailed schematic diagram of the preferred embodiment of the invention. As shown therein, the frequency control 10 produces a variable voltage at the output of buffer inverter 16 which varies between −15V and +15V. This voltage is applied to comparators 22 which selectively deactivate gain control switches 24 and offset control switches 28 to selectively vary gain control 20 and offset control 30. The gain and offset are varied such that five voltage swings are produced at node 32 which vary linearly in a sawtooth waveform pattern at various magnitudes between 0 and 10V as the voltage at node 11 varies between −15V and +15V. This is more clearly shown in FIGS. 2a and 2c.

FIG. 2a shows the voltage at node 11 as a function of the desired output frequency. As this voltage is varied linearly between −15V and +15V, the voltage at node 32, which is the output voltage of the VCO driver, is varied in gain and offset to produce the voltage waveform pattern shown in FIG. 2c.

The voltage waveform patterns produced at node 32 are applied to the YIG voltage-controlled oscillator 36, which produces an RF signal between 1 and 2 GHz, varying in frequency proportionally to the input voltage. Since the voltage produced at node 32 varies in different magnitudes between 0 and 10V as shown in FIG. 2c, the output frequency of YIG VCO 36 varies somewhere between 1 and 2 GHz. This signal is applied to a relay which is controlled by relay driver 56. Relay driver 56 controls the operation of relay 58 so that when the desired output frequency is between 1 and 2 GHz, the YIG VCO signal is applied directly to the directional coupler 42 where it is coupled to the output. In all other conditions, relay 58 supplies the RF signal from YIG VCO 36 to the YIG multiplier 40. Harmonic generation is provided in YIG multiplier 40 by a nonlinear element comprising a diode 60. The output of the multiplier driver 18 is applied to the filter tracking frequency input of the YIG multiplier 40 which controls the amount of current to the magnetic coils of the YIG multiplier, thereby controlling the output tracking frequency. The output signal of the multiplier driver 18 is shown in FIG. 2b. Between 1 and 2 GHz, of course, no voltage is present since relay 58 ties the 1 to 2 GHz signal directly to the output via the directional coupler 42. From 2 to 18 GHz the output of the multiplier driver 18 varies linearly between 0 and 10V as the frequency control voltage produced at node 11 varies linearly between −15V and +15V. In this manner, the filter tracking frequency can be varied linearly for the entire frequency range.

In operation, the multiplier driver 18 takes the output voltage of buffer inverter 16 and varies its gain and initial offset to produce the voltage waveform shown in FIG. 2b. The feedback control loop is tied to the offset voltage input to the multiplier driver 18 at the output of the difference amplifier 46. By varying the offset voltage by the difference amplifier 46, the filter tracking frequency is also varied. The output power level is also changed by varying the filter tracking frequency of the YIG multiplier in a manner which can be more fully understood by referring to FIG. 3.

FIG. 3 illustrates the output power of the YIG multiplier versus the YIG multiplier tracking frequency. Whenever the desired power output level set on potentiometer 48 is below the maximum output power of the YIG multiplier 40 corresponding to a power level $P_1$, as shown in FIG. 3, the device will operate in a stable condition. For any preselected frequency $f_1$, various output power levels can be produced by varying the tracking frequency of the power response curve at the YIG multiplier. For a maximum power output corresponding to a power level $P_1$, difference amplifier 46 varies the offset voltage to multiplier driver 18 to shift the power response curve in frequency to position A. When the desired power output level is set on potentiometer 48 at a power level corresponding to $P_2$, shown in FIG. 3, the output voltage of the difference amplifier 46 causes the filter tracking frequency to vary the offset voltage to multiplier driver 18 to shift the power response curve to position B. In this manner, the power response curve of the YIG multiplier 40 functions to attenuate the output signal to produce an automatically leveled output.

The present device therefore provides a wideband signal generator which produces a constant power output over the entire frequency range of 1 to 18 GHz. This is accomplished through the use of a feedback loop which senses output power to vary the frequency of the tracking filter of the device. It controls the tracking frequency in a manner such that the YIG VCO and the YIG multiplier track simultaneously, thereby avoiding alignment problems. The device accomplishes this with small size, low weight and at a fairly low cost. It provides ease of maintenance and high reliability. In addition, it provides for selection of output power level which is constant across entire frequency range.

Obviously many modifications and variations of the present invention are possible in light of the above teachings. It is therefore to be understood that within the scope of the appended claims the invention may be practiced otherwise than as specifically described.

What is claimed is:
1. A wideband microwave signal generator having stable frequency adjustment and leveled output power across its frequency range comprising:
   a. frequency control means for generating a variable DC voltage signal across a predetermined voltage range;
   b. means for producing a microwave signal having a series of frequency swings across a first predetermined frequency range as said variable DC voltage is varied across said predetermined voltage range;
   c. multiplier means for generating harmonics from said microwave signal and filtering selected harmonics in response to a filter tracking voltage to produce a microwave output signal;
   d. means for varying offset and gain of said variable DC voltage to produce said filter tracking voltage;
   e. means for comparing output power of said microwave output signal with a desired power level signal to generate a difference voltage signal;
   f. means for applying said difference voltage signal to said means for varying offset and gain of said variable DC voltage to vary said filter tracking voltage until the output power level of said microwave output signal matches said desired power level;
   g. means for limiting said difference voltage signal to cause said multiplier means to track over only a second predetermined range of frequencies.
2. The signal generator of claim 1 wherein said means for limiting said difference voltage signal comprises means for comparing said difference voltage signal with a predetermined voltage to shift the magnitude of said desired power level whenever said difference voltage signal exceeds a predetermined level.
3. The signal generator of claim 1 wherein said means for comparing comprises a difference amplifier with capacitive feedback connected to compare a first signal representative of output power with a second signal derived from a potentiometer.
4. The signal generator of claim 2 wherein said means for comparing comprises a difference amplifier with capacitive feedback connected to compare a first signal representative of output power with a second signal derived from a potentiometer.
5. In an oscillator, multiplier wideband microwave signal generator a device for controlling multiplier filter tracking frequency to produce a leveled output power microwave signal comprising:
   a. means for detecting output power of said microwave signal;
   b. means for comparing output power with a desired output power level to produce a difference signal;
   c. means for adjusting multiplier filter tracking frequency in response to said difference signal until the power response of said multiplier filter matches said desired output power level;
   d. means for automatically shifting said desired output power level to cause said means for adjusting multiplier filter tracking frequency to track across a predetermined range of frequencies whenever said difference signal exceeds a predetermined level.
6. The signal generator of claim 5 further comprising means for indicating whenever said difference signal exceeds a predetermined level.
7. The signal generator of claim 5 wherein said means for adjusting multiplier filter tracking frequency comprises a multiplier driver circuit in which said difference signal varies input offset voltage.
8. The signal generator of claim 5 wherein said means for comparing comprises an operational amplifier with capacitive negative feedback.
9. The signal generator of claim 5 wherein said means for automatically shifting comprises operational amplification means connected at its output to zener diodes to cause said output of said operational amplification means to shift from a negative to a positive voltage whenever said difference signal exceeds a predetermined level.

10. The signal generator of claim 8 wherein said means for automatically shifting comprises operational amplification means connected at its output to zener diodes to cause said output of said operational amplification means to shift from a negative to a positive voltage whenever said difference signal exceeds a predetermined level.

* * * * *